(12) United States Patent
Huang et al.

(10) Patent No.: US 12,324,141 B2
(45) Date of Patent: Jun. 3, 2025

(54) MEMORY AND METHOD FOR FORMING SAME

(71) Applicant: CHANGXIN MEMORY TECHNOLOGIES, INC., Hefei (CN)

(72) Inventors: Juanjuan Huang, Hefei (CN); Yi Jiang, Hefei (CN); Weiping Bai, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 541 days.

(21) Appl. No.: 17/807,769

(22) Filed: Jun. 20, 2022

(65) Prior Publication Data

US 2023/0301054 A1 Sep. 21, 2023

Related U.S. Application Data

(63) Continuation of application No. PCT/CN2022/085762, filed on Apr. 8, 2022.

(30) Foreign Application Priority Data

Mar. 21, 2022 (CN) .......................... 202210276127.0

(51) Int. Cl.
H10B 12/00 (2023.01)
(52) U.S. Cl.
CPC ............. H10B 12/05 (2023.02); H10B 12/30 (2023.02)
(58) Field of Classification Search
None
See application file for complete search history.

(56) References Cited

U.S. PATENT DOCUMENTS

2014/0191300 A1 7/2014 Jhaveri
2015/0287779 A1 10/2015 Jhaveri et al.
(Continued)

FOREIGN PATENT DOCUMENTS

CN 105304638 A 2/2016
CN 107623033 A 1/2018
(Continued)

OTHER PUBLICATIONS

J.A. Kittl et al., Microelectron. Eng. 86, 2009, Microelectronic Engineering, Comprehensive investigation of trap-assisted conduction in ultra-thin SrTiO3 layers.
(Continued)

*Primary Examiner* — Michelle Mandala
(74) *Attorney, Agent, or Firm* — Syncoda LLC; Feng Ma

(57) ABSTRACT

A method for forming a memory includes the following operations: a substrate and a semiconductor layer located on the substrate are formed; the semiconductor layer is patterned to form a plurality of first isolation structures and channel regions, each first isolation structure includes a first through hole and a second through hole, and a first isolation pillar located between the first through hole and the second through hole; a first filling layer filling up the first through hole and the second through hole is formed; the first isolation pillar is removed to form a third through hole located in the first filling layer; a barrier layer filling up the third through hole is formed; the channel regions are exposed by removing the first filling layer; and a gate layer covering surfaces of the channel regions is formed.

15 Claims, 15 Drawing Sheets

(56) References Cited

U.S. PATENT DOCUMENTS

| | | | |
|---|---|---|---|
| 2023/0066597 A1* | 3/2023 | Cheng | H10D 84/038 |
| 2023/0225131 A1* | 7/2023 | Lin | H10D 64/258 |
| | | | 257/295 |
| 2024/0172418 A1* | 5/2024 | Hua | H01L 21/768 |

FOREIGN PATENT DOCUMENTS

| | | |
|---|---|---|
| CN | 110148598 A | 8/2019 |
| CN | 113611671 A | 11/2021 |
| CN | 114121819 A | 3/2022 |

OTHER PUBLICATIONS

Extended European Search Report in application 22924564, mailed on Aug. 2, 2024.

* cited by examiner

MEMORY AND METHOD FOR FORMING SAME

CROSS-REFERENCE TO RELATED APPLICATIONS

This is a continuation of International Patent Application No. PCT/CN2022/085762 filed on Apr. 8, 2022, which claims priority to Chinese Patent Application No. 202210276127.0 filed on Mar. 21, 2022. The disclosures of the above referenced applications are hereby incorporated by reference in their entirety.

BACKGROUND

A dynamic random access memory (DRAM) is a semiconductor apparatus commonly used in electronic devices, such as a computer. It is composed of a plurality of memory cells. Each memory cell usually includes a transistor and a capacitor. A gate of the transistor is electrically connected to a word line, a source is electrically connected to a bit line, and a drain is electrically connected to the capacitor. A word line voltage applied on the word line can control on and off of the transistor, such that data information stored in the capacitor can be read or the data information can be written into the capacitor through the bit line.

With the size of memories, such as the DRAM, being decreased, gate structures in a memory have developed to gate all around (GAA) structures with smaller occupied area, and the memory has also developed from a two-dimensional structure to a three-dimensional structure. However, in a three-dimensional memory, the thickness uniformity between adjacent gate layers is poor, and materials as options for a barrier layer configured to isolate the adjacent gate layers is relatively less due to the limitations of the preparation process and the like, for example, the material of a barrier layer is generally silicon oxide, which reduces the performance of the memory and is not conductive to the simplification of the memory manufacturing process and the reduction of the memory manufacturing cost.

Therefore, urgent technical problems to be solved at present may reside in how to reduce the thickness difference between different gate layers in a memory, improve the selection flexibility of a material for the barrier layers, improve the isolation effect between adjacent gate layers, and reduce the capacitive coupling effect between adjacent gate layers, so as to improve the performance of the memory.

SUMMARY

The disclosure relates to the technical field of semiconductor manufacturing, and particularly, to a memory and a method for forming the same.

A memory and a method for forming the same provided by some embodiments of the disclosure.

According some embodiments, the disclosure provides a method for forming a memory, which may include the following operations.

A substrate and a semiconductor layer located on the substrate are formed.

The semiconductor layer is patterned to form a plurality of first isolation structures. Part of the semiconductor layer remaining between two adjacent ones of the first isolation structures forms channel regions. Each of the first isolation structures includes a first through hole and a second through hole penetrating through the semiconductor layer in a direction perpendicular to a top surface of the substrate, and a first isolation pillar formed by the semiconductor layer remaining between the first through hole and the second through hole.

A first filling layer that fills up the first through hole and the second through hole is formed.

The first isolation pillar is removed to form a third through hole located in the first filling layer.

A barrier layer that fills up the third through hole is formed.

The channel regions are exposed by removing the first filling layer.

A gate layer that covers the surfaces of the channel regions is formed.

According some other embodiments, the disclosure further provides a memory, which includes a substrate, a plurality of channel region groups, a plurality of barrier layers, and a plurality of gate layers.

The channel region groups are located above the substrate. In the direction parallel to a top surface of the substrate, a plurality of the channel region groups are arranged in parallel. Each of the channel region groups includes a plurality of channel regions arranged in parallel in a direction perpendicular to the top surface of the substrate.

The barrier layers are located above the substrate, and each of the barrier layers is located between two adjacent ones of the channel region groups.

The gate layers are located above the substrate. Each of the gate layers is at least located between one barrier layer and one channel region group, and covers surfaces of all the channel regions in the channel region group. Thicknesses of the gate layers located on two opposite sides of one of the barrier layers are equal.

DETAILED DESCRIPTION

Specific embodiments of a memory and a method for forming same provided by the disclosure is described in detail below with reference to the accompanying drawings.

Figure 1:
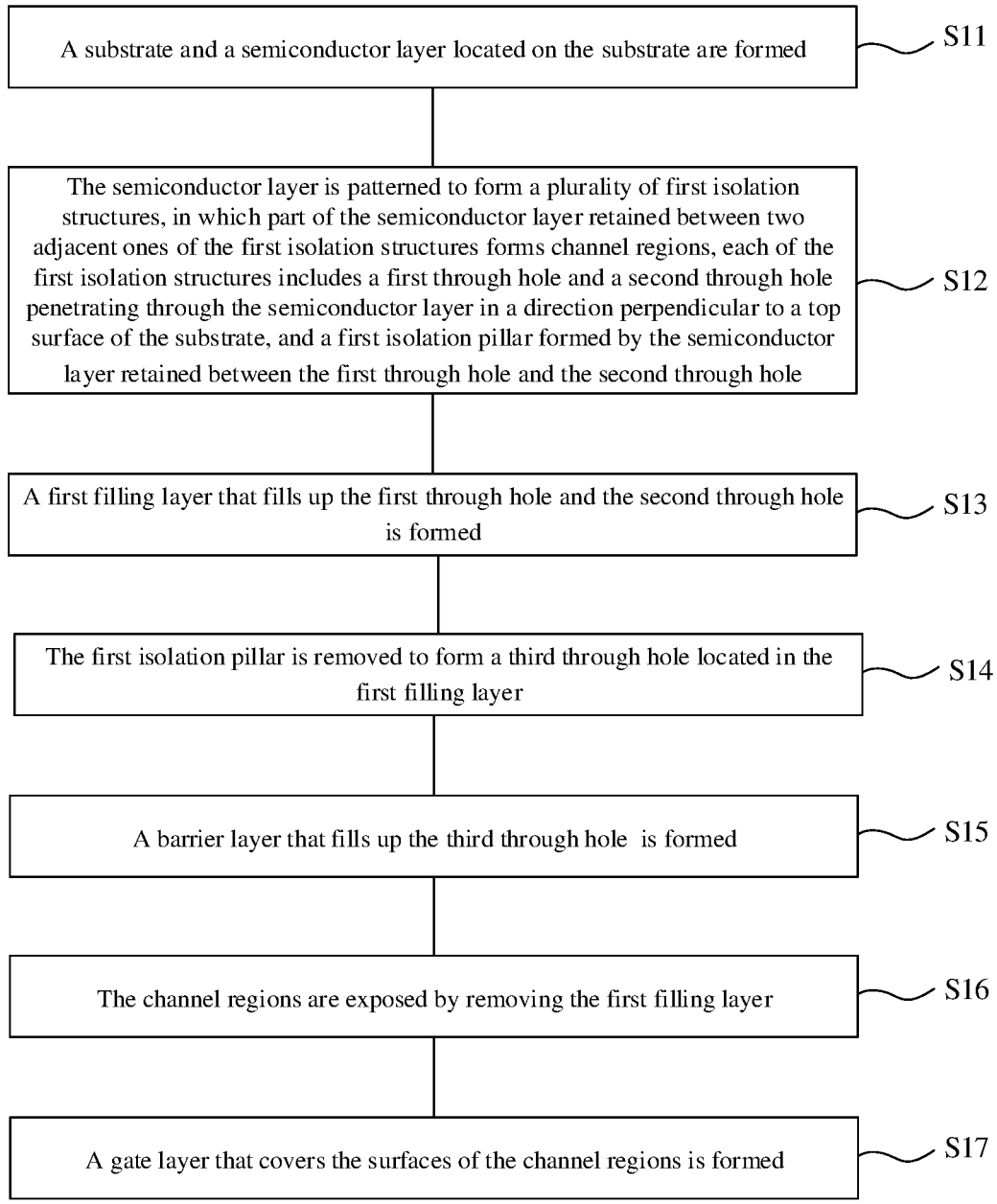
FIG. 1 illustrates a flowchart of a method for forming a memory in a specific embodiment of the disclosure.
Figure 2:
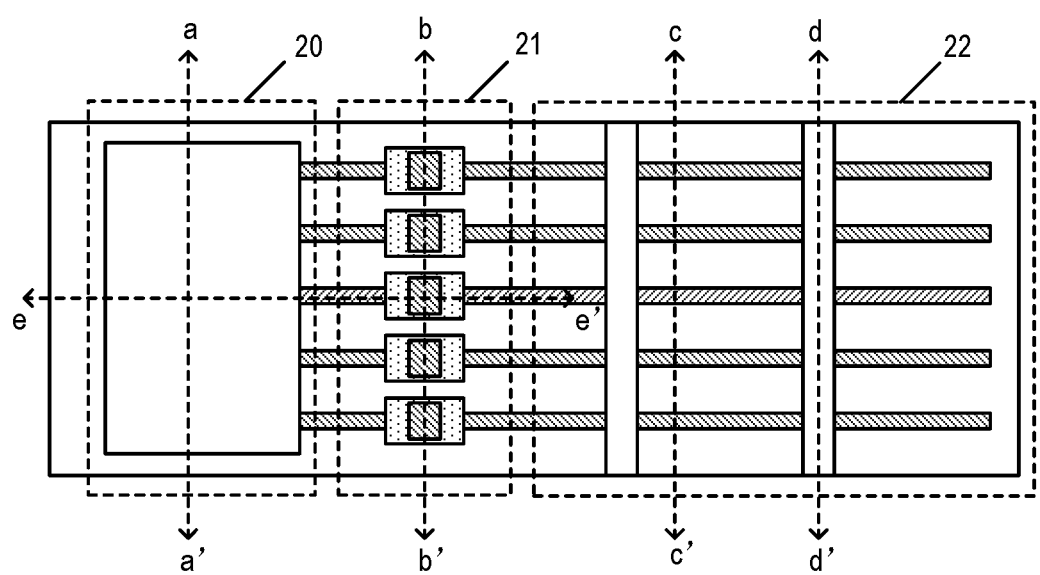
FIG. 2 illustrates a schematic diagram of a top view of a memory formed by a specific embodiment of the disclosure.

A specific embodiment of the disclosure provides a memory. FIG. 1 illustrates a flowchart of a method for forming a memory in a specific embodiment of the disclosure. FIG. 2 illustrates a schematic diagram of a top view of a memory formed by a specific embodiment of the disclosure. FIG. 3A to FIG. 3K illustrate schematic diagrams of sectional views of main processes during forming the memory of a specific embodiment of the disclosure. FIG. 3A to FIG. 3J illustrate schematic diagrams of sectional views of main processes during forming a semiconductor device from fives directions of direction a-a', direction b-b', direction c-c', direction d-d', and direction e-e' shown in FIG. 2, so as to clearly show the process for forming the semiconductor device. The semiconductor device in the present specific embodiment may be, but is not limited to, a DRAM. As shown in FIG. 1, FIG. 2, and FIG. 3A to FIG. 3K, the method for forming a memory includes the following operations.

At S11, a substrate 30 and a semiconductor layer located on the substrate 30 are formed.

In some embodiments, the operation that a substrate 30 and a semiconductor layer located on the substrate 30 are formed includes the following specific operations.

A substrate 30 is provided.

Figure 3A:
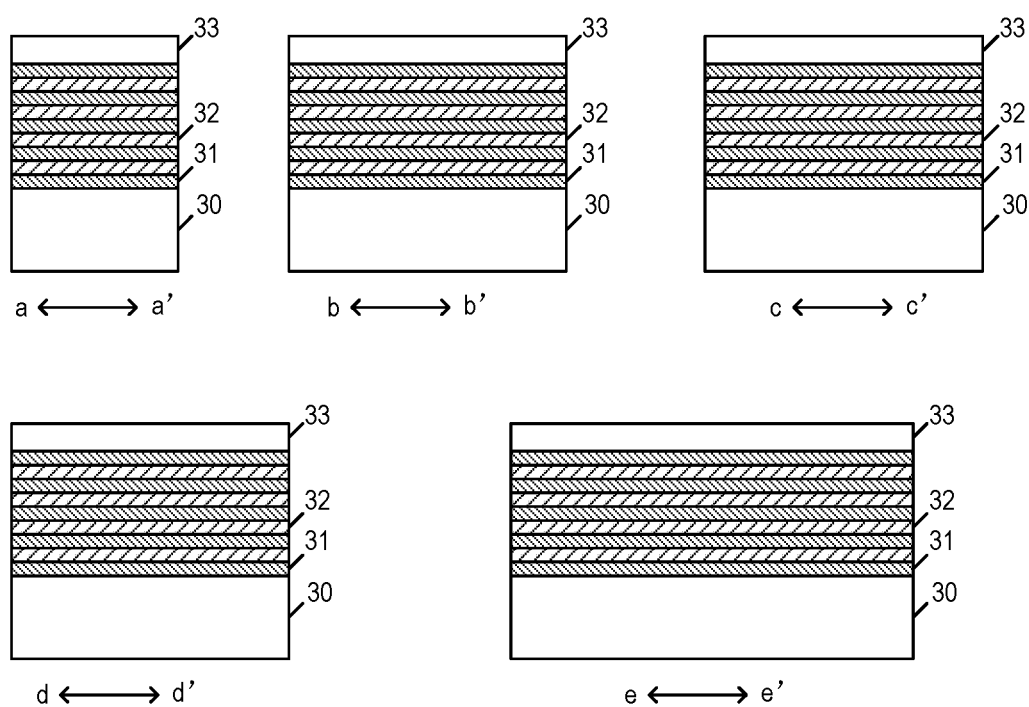
FIG. 3A illustrates a first schematic diagram of sectional views of main processes during forming the memory of a specific embodiment of the disclosure.

A first sub-semiconductor layer 31 and a second sub-semiconductor layer 32 are alternately deposited on a top surface of the substrate 30 in a direction perpendicular to the top surface of the substrate 30 to form the semiconductor layer, as shown in FIG. 3A.

The substrate 30 may be, but is not limited to, a silicon substrate. The present specific embodiment is described by taking the silicon substrate as the substrate 30 as an example. In other examples, the substrate 30 may be a semiconductor substrate such as gallium nitride, gallium arsenide, gallium carbide, silicon carbide or SOI. After that, first sub-semiconductor layers 31 and second sub-semiconductor layers 32 are alternately deposited on the top surface of the substrate 30 in the direction perpendicular to the top surface of the substrate 30 by a chemical vapor deposition process, a physical vapor deposition process or an atomic layer deposition process, so as to form the semiconductor layer with a superlattice stack structure, so as to further improve the storage density of the memory.

In some embodiments, the material of the first sub-barrier layer 31 may be Si, and the material of the second sub-barrier layers 32 may be SiGe.

Figure 3B:
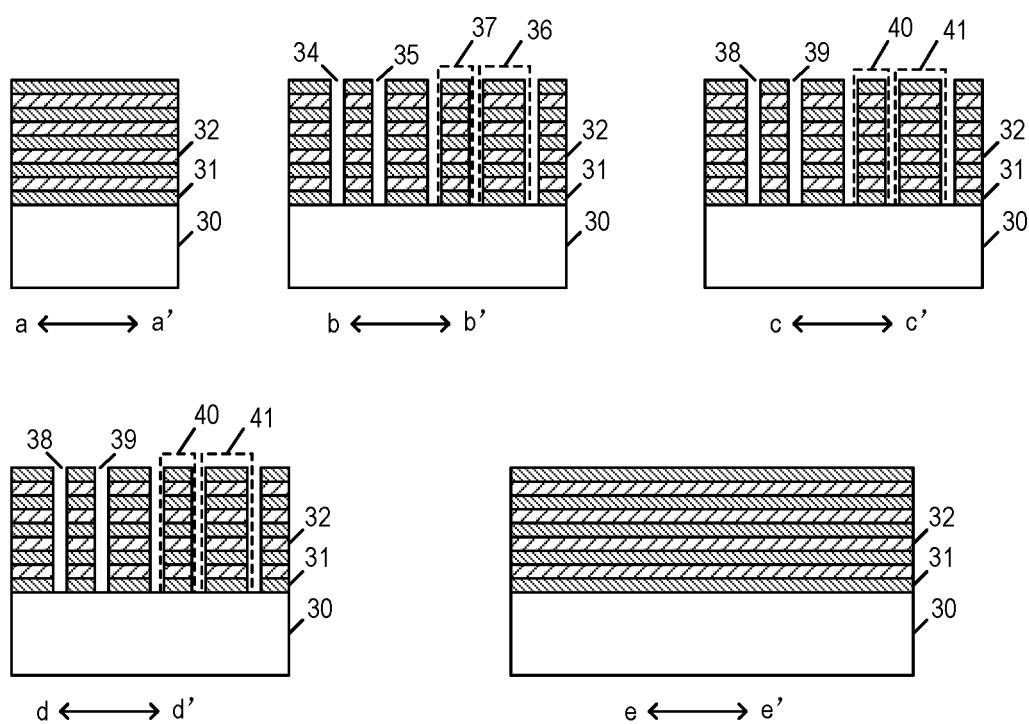
FIG. 3B illustrates a second schematic diagram of sectional views of main processes during forming the memory of a specific embodiment of the disclosure.

At S12, the semiconductor layer is patterned to form a plurality of first isolation structures. Part of the semiconductor layer remaining between two adjacent ones of the first isolation structures forms channel regions. Each first isolation structure includes a first through hole 34 and a second through hole 35 penetrating through the semiconductor layer in a direction perpendicular to a top surface of the substrate 30, and a first isolation pillar 37 formed by the semiconductor layer remaining between the first through hole 34 and the second through hole 35, as shown in FIG. 3B.

In some embodiments, the operation that the semiconductor layer is patterned includes the following specific operation.

The semiconductor layer is etched to form a plurality of first isolation structures that extend in a first direction and are parallel to one another. Each of the first isolation structures includes the first isolation pillar 37, the first through hole 34 and the second through hole 35, in which the first through hole 34 and the second through hole 35 are arranged on two opposite sides of the first isolation pillar 37 and extend in a second direction. The first sub-semiconductor layers 31 remaining between two adjacent first isolation structures form channel regions. The first direction is the direction parallel to the top surface of the substrate 30. The second direction is the direction parallel to the top surface of the substrate 30 and intersects the first direction.

Specifically, the semiconductor layer may be etched in the direction perpendicular to the top surface of the substrate 30 by a self-aligned double patterning (SADP) process or a self-aligned quadruple patterning (SAQP) process in combination with a dry etching process. When a plurality of active pillars 36 (a plurality of the active pillars 36 are parallel to each other and are arranged at intervals) that extend in a first direction (for example, e-e' in FIG. 2 and FIG. 3A to FIG. 3J) are formed, the first isolation structures configured to isolating adjacent active pillars 36 are formed. Each first isolation structure includes a first through hole 34, a first isolation pillar 37, and a second through hole 35 arranged in sequence in a second direction (for example, b-b' in FIG. 2 and FIG. 3A to FIG. 3J). The active pillar 36 includes the first sub-semiconductor layers 31 and the second sub-semiconductor layers 32 that are alternately stacked in the direction perpendicular to the top surface of the substrate 30. The first sub-semiconductor layers 31 in the active pillar 36 form channel regions. A plurality of the first isolation structures are parallel to each other, and are arranged at intervals in the second direction. Both the first through hole 34 and the second through hole 35 are configured to form gate layers subsequently, and the first isolation pillar 37 located between the first through hole 34 and the second through hole 35 is configured to form a barrier layer of the two adjacent gate layers subsequently.

In some embodiments, the inside diameter of the first through hole 34 is equal to that of the second through hole 35 in the second direction (for example, b-b' in FIG. 2 and FIG. 3A to FIG. 3J).

In particular, both the first through hole 34 and the second through hole 35 are configured to subsequently form gate layers, and the first isolation pillar 37 located between the first through hole 34 and the second through hole 35 is configured to subsequently form a barrier layer of the two adjacent gate layers. The thickness difference between the gate layers subsequently formed in the first through hole 34 and the second through hole 35 can be reduced by controlling the inside diameter of the first through hole 34 to be equal to that of the second through hole 35 when the semiconductor layer is etched to form the active pillars 36. For example, the thickness of the gate layer formed in the first through hole 34 is made equal to that of the gate layer formed in the second through hole 35, which avoids the thickness fluctuation caused by the etching difference when gate metal layers are formed by using an etching process, thereby further improving the thickness uniformity of the gate layers in the memory, and improving the electrical performance of the memory.

In order to increase the spaces for forming GAA structures subsequently to further simplify a manufacturing process of the memory, in some embodiments, the width of the first isolation pillar 37 is less than that of the channel region in the second direction.

In some embodiments, the semiconductor layer includes a first region 21, and a second region 22 arranged at an outer side of the first region 21 in the first direction. The operation that the semiconductor layer is etched includes the following specific operations.

The first region and the second region of the semiconductor layer are etched, a plurality of the first isolation structures and a plurality of the channel regions are formed in the first region, and simultaneously a plurality of second isolation structures are formed in the second region. The semiconductor layer remaining between two adjacent second isolation structures forms virtual channel regions. Each second isolation structure includes a fourth through hole 38 and a fifth through hole 39 both penetrating through the semiconductor layer in the direction perpendicular to the top surface of the substrate 30, and a second isolation pillar 40 formed by the semiconductor layer remaining between the fourth through hole 38 and the fifth through hole 39, as shown in FIG. 3B.

Particularly, as shown in FIG. 2, the semiconductor layer includes a first region 21, a second region 22 arranged at an outer side of the first region 21 in the first direction (for example, e-e' in FIG. 2 and FIG. 3A to FIG. 3J), and a third region 20 arranged at an outer side of the first region 21 in the first direction (for example, e-e' in FIG. 2 and FIG. 3A to FIG. 3J). The first region 21 is located between the second region 22 and the third region 20. For example, the first region 21 may be a transistor region, the second region 22 may be a capacitor region, the third region 20 may be a bit line region (for example, a step-type bit line structure region), and the first region 21 is electrically connected to both the second region 22 and the third region 20.

The second region 22 of the semiconductor layer is etched while etching the first region 21 of the semiconductor layer to form the active pillar 36, so as to form a plurality of the virtual active pillars 41 extending in the first direction (for example, e-e' in FIG. 2 and FIG. 3A to FIG. 3J) in the second region 22 when the active pillars 36 and the first isolation structures are formed in the first region 21 at the same time. The plurality of virtual active pillars 41 are parallel to one another and are arranged at intervals in a third direction (for example, d-d' in FIG. 2 and FIG. 3A to FIG. 3J). A second isolation structure is formed between two adjacent ones of the virtual active pillars 41. Each second isolation structure includes a fourth through hole 38, a second isolation pillar 40, and a fifth through hole 39 arranged in sequence in the third direction. The virtual active pillar 41 includes the first sub-semiconductor layers 31 and the second sub-semiconductor layers 32 that are alternately stacked in the direction perpendicular to the top surface of the substrate 30. The first sub-semiconductor layers 31 in the virtual active pillar 41 form the virtual channel regions.

Figure 3C:
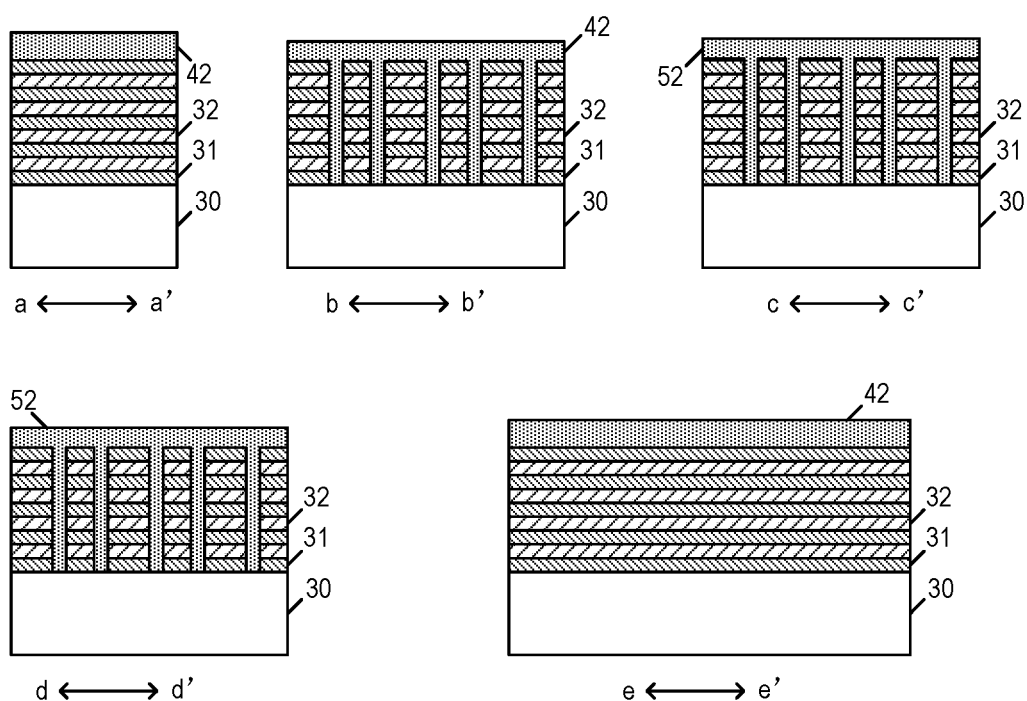
FIG. 3C illustrates a third schematic diagram of sectional views of main processes during forming the memory of a specific embodiment of the disclosure.

At S13, a first filling layer 42 that fills the first through hole 34 and the second through hole 35 is formed, as shown in FIG. 3C.

Particularly, an oxide material (for example, silicon dioxide) may be deposited in the first through hole 34 and the second through hole 35 and on the top surface of the semiconductor layer by a chemical vapor deposition process, a physical vapor deposition process or an atomic layer deposition process, and the first filling layer 42 is formed by a chemical-mechanical polishing (CMP) process. There is a relatively large etching selectivity between the material of the first filling layer 42 and the material of the semiconductor layer, so that part of the semiconductor layer can be selectively removed subsequently. In some embodiments, both the etching selectivity between the first filling layer 42 and the first sub-semiconductor layer 31 and the etch selectivity between the first filling layer 42 and the second sub-semiconductor layer 32 are greater than 3.

Figure 3D:
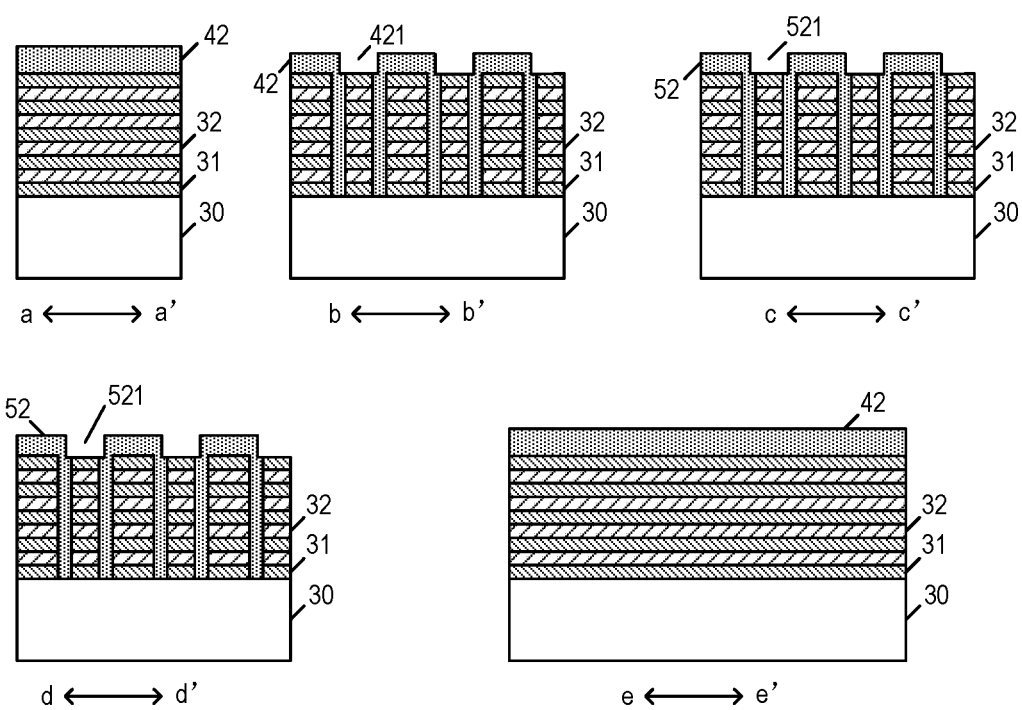
FIG. 3D illustrates a fourth schematic diagram of sectional views of main processes during forming the memory of a specific embodiment of the disclosure.
Figure 3E:
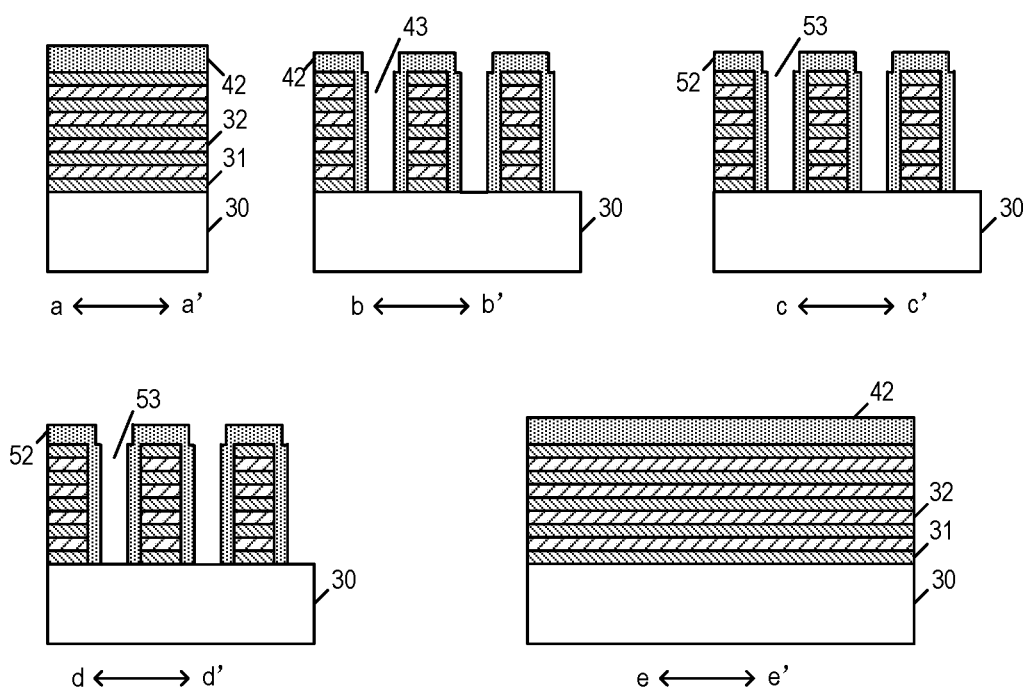
FIG. 3E illustrates a fifth schematic diagram of sectional views of main processes during forming the memory of a specific embodiment of the disclosure.

At S14, the first isolation pillar 37 is removed to form a third through hole 43 located in the first filling layer 42, as shown in FIG. 3E.

In some embodiments, the operation that the third through hole 43 located in the first filling layers 42 is formed includes the following specific operations.

The first filling layer 42 located on the top surface of the first region 21 of the semiconductor layer is etched to form a first opening 421 exposing the first isolation pillar 37, as shown in FIG. 3D.

The first isolation pillar 37 is removed along the first opening 421 to form the third through hole 43 in the first region 21, as shown in FIG. 3E.

Particularly, after the first filling layer 42 is formed, a patterning process may be performed on the first filling layer 42 by using a photoetching process, so as to form the first opening 421 exposing the top surface of the first isolation pillar 37 in the first filling layer 42, as shown in FIG. 3D. After that, the first isolation pillar 37 is subjected to the self-aligned etching along the first opening 421, and the third through hole 43 is formed after the first isolation pillar 37 is completely removed, as shown in FIG. 3E. In the present specific embodiment, both the etching selectivity between the first filling layer 42 and the first sub-semiconductor layer 31 and the etching selectivity between the first filling layer 42 and the second sub-semiconductor layer 32 are controlled to be greater than 3, so that the first filling layer 42 is not damaged when the first isolation pillar 37 is removed. Therefore, the thickness uniformity of the gate layers later formed in the first through hole 34 and the second through hole 35 can be improved.

In order to guarantee that the first isolation pillar 37 is fully removed, in some embodiments, the width of the first opening 421 is greater than or equal to the width of the first isolation pillar 37 in the second direction.

Figure 3F:
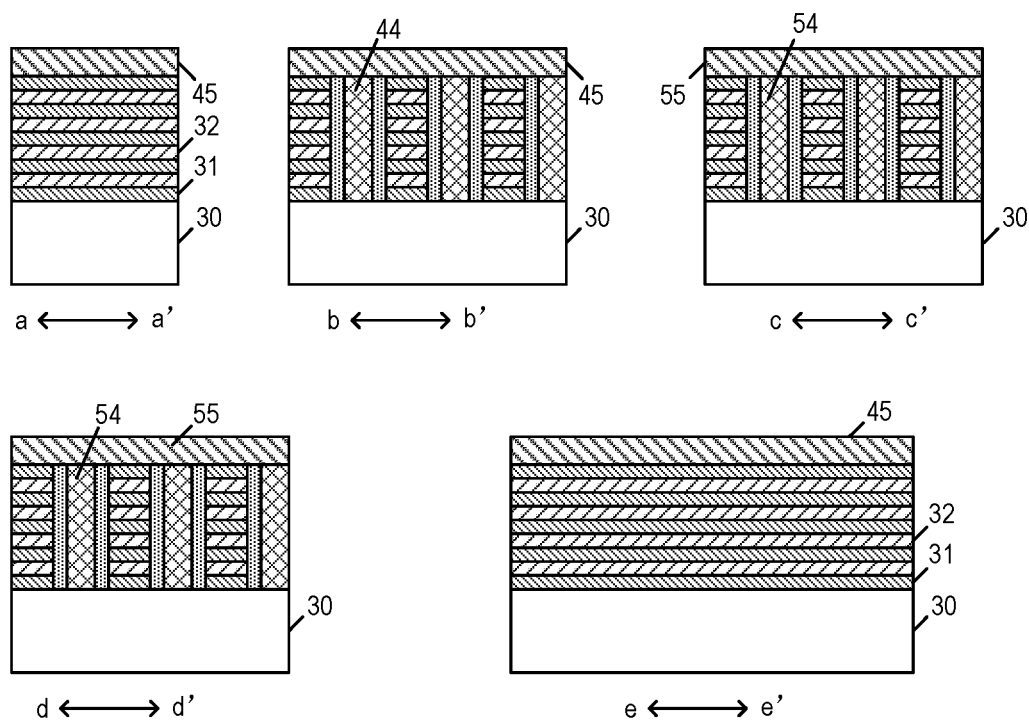
FIG. 3F illustrates a sixth schematic diagram of sectional views of main processes during forming the memory of a specific embodiment of the disclosure.

At S15, a barrier layer 44 that fills up the third through hole 43 is formed, as shown in FIG. 3F.

In some embodiments, the operation that the barrier layer 44 that fills up the third through hole 43 is formed includes the following specific operation.

An insulating material is deposited in the third through hole 43 along the first opening 421 to form the barrier layer 44 in the first region 21.

Particularly, an insulating material such as nitride (for example, silicon nitride) or the like may be deposited into the third through hole 43 along the first opening 421 by a chemical vapor deposition process, a physical vapor deposition process, or an atomic layer deposition process, so as to form the barrier layer 44 for electrically isolating the adjacent gate layers. After that, both of the first filling layer 42 and the barrier layer 44 that remain on the top surface of the semiconductor layer are removed by a CMP process, so as to expose the top surface of the semiconductor layer. After that, an insulating material such as an oxide (for example, silicon dioxide) or the like is deposited on the top surface of the first region 21 of the semiconductor layer and the top surface of the barrier layer 44 to form a first covering layer 45 that covers the top surface of the first region 21 of the semiconductor layer and the top surface of the barrier layer 44, as shown in FIG. 3F.

Figure 3G:
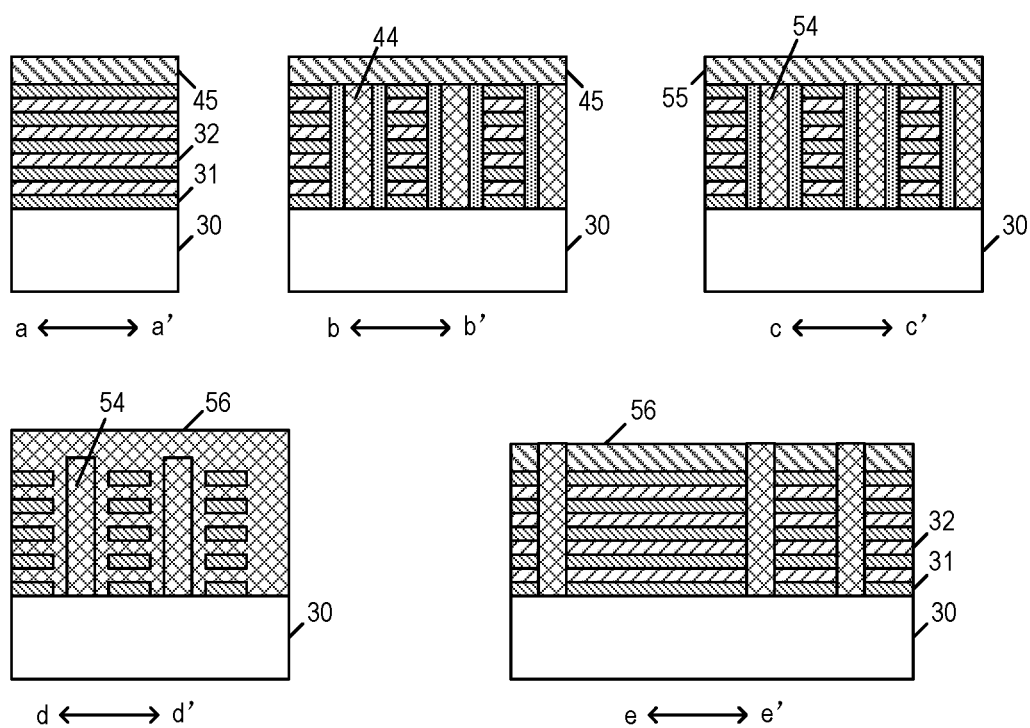
FIG. 3G illustrates a seventh schematic diagram of sectional views of main processes during forming the memory of a specific embodiment of the disclosure.
Figure 3H:
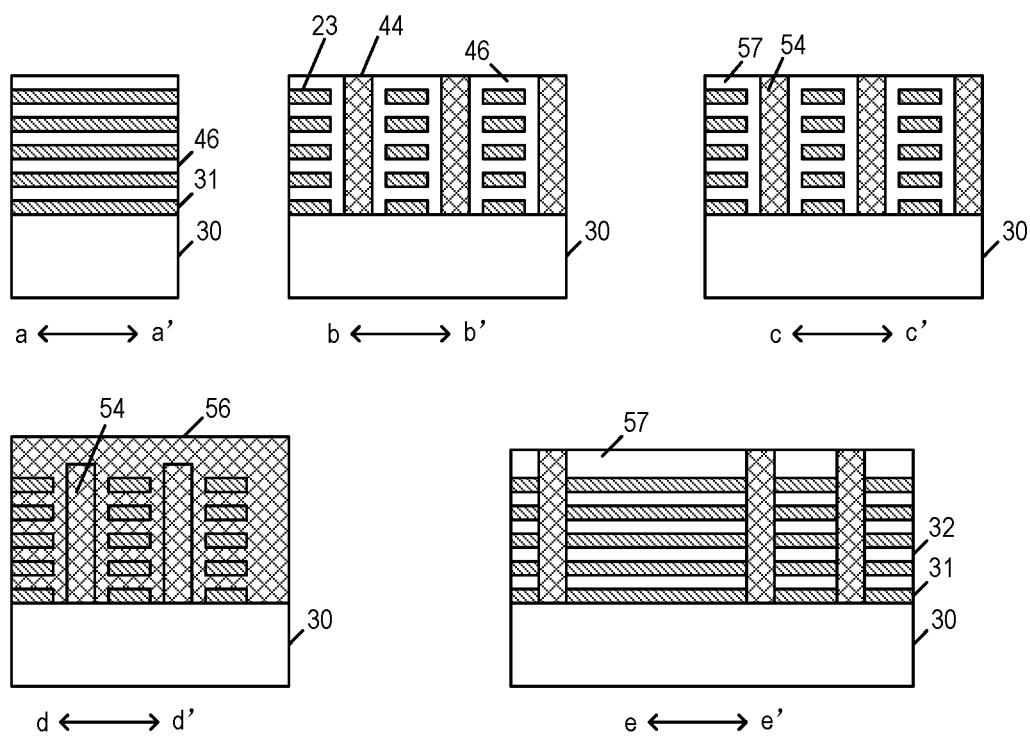
FIG. 3H illustrates an eighth schematic diagram of sectional views of main processes during forming the memory of a specific embodiment of the disclosure.
Figure 3I:
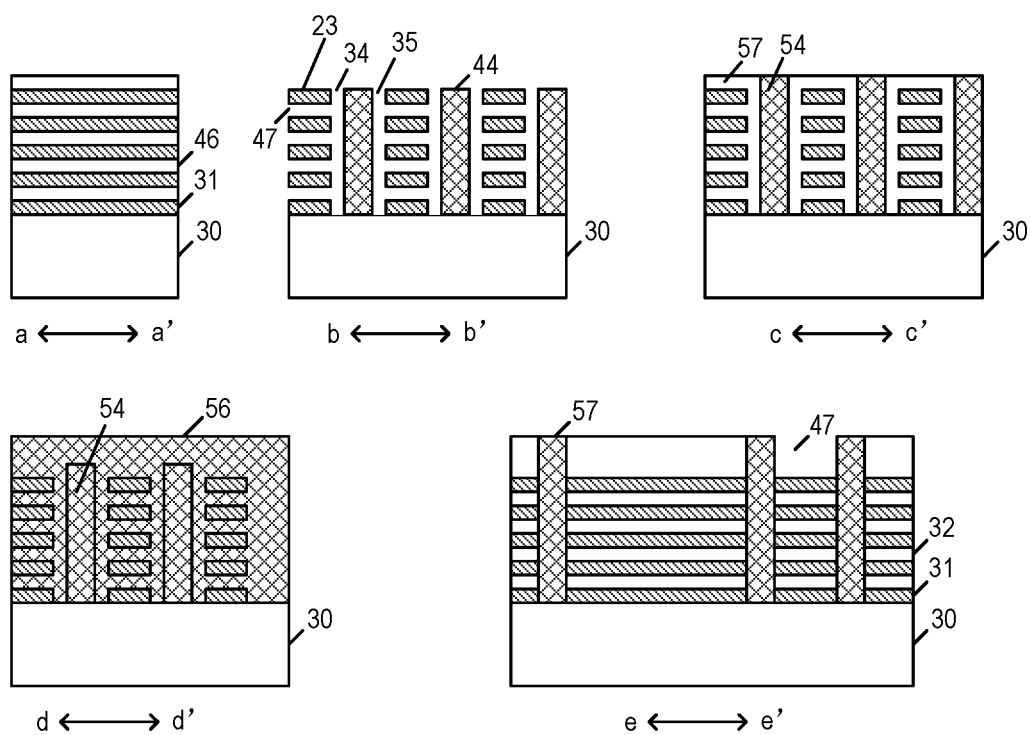
FIG. 3I illustrates a ninth schematic diagram of sectional views of main processes during forming the memory of a specific embodiment of the disclosure.

At S16, the first filling layer 42 is removed to expose the channel regions 23, as shown in FIG. 3I.

In some embodiments, before exposing the channel regions 23, the method further includes the following operation.

A support layer 56 is formed in the second region 22 of the semiconductor layer, as shown in FIG. 3G.

Particularly, in order to prevent toppling or collapse during exposing the channel regions 23, before exposing the channel regions 23, a support layer 56 is formed in the second region 22 connected to the first region 21 first, so as to support the first region 21, thereby improving the structural stability of the first region 21.

In some embodiments, the operation that the support layer 56 is formed in the second region 22 of the semiconductor layer includes the following specific operations.

A second filling layer 52 that fills up the fourth through hole 38 and the fifth through hole 39 and covers the top surface of the second region 22 is formed, as shown in FIG. 3C.

The second isolation pillar 40 is removed to form a sixth through hole 53 in the second filling layer 52, as shown in FIG. 3E.

A first sacrificial layer 54 is formed in the sixth through hole 53, as shown in FIG. 3F.

The second filling layer 52 is removed from the fourth through hole 38 and the fifth through hole 39, so as to expose the fourth through hole 38 and the fifth through hole 39.

Part of the second sub-semiconductor layers 32 located in the second region 22 are removed along the fourth through hole 38 and the fifth through hole 39, so as to form a first gap region located between two adjacent ones of the first sub-semiconductor layers 31.

A dielectric material is filled in the fourth through hole 38, the fifth through hole 39, and the first gap region to form the support layer 56, as shown in FIG. 3G.

Particularly, an oxide material (for example, silicon dioxide) may be deposited in the fourth through hole 38 and the fifth through hole 39 and may cover the top surface of the second region 22 of the semiconductor layer by an atomic layer deposition process, so as to form the second filling layer 52, as shown in FIG. 3C. In some embodiments, the operation of filling the fourth through hole 38 and the fifth through hole 39 may be performed simultaneously with the operation of filling the first through hole 34 and the second through hole 35. That is, the first filling layer 42 and the second filling layer 52 are formed simultaneously. After the second filling layer 52 is formed, the second filling layer 52 is patterned, and a second opening 521 that exposes the top surface of the second isolation pillar 40 is formed in the second filling layer 52, as shown in FIG. 3D. After that, the second isolation pillar 40 is subjected to self-aligned removal along the second opening 521 to form the sixth through hole 53 in the second filling layer 52, as shown in FIG. 3E. Then, an insulating dielectric material such as nitride (for example, silicon nitride) or the like is deposited into the sixth through hole 53 along the second opening 521 to form a first sacrificial layer 54. After both of the second filling layer and remaining first sacrificial layer 54 that are on the top surface of the second region of the semiconductor layer are removed through CMP, an insulating material such as an oxide (for example, silicon dioxide) or the like is deposited on the top surface of the second region 22 of the semiconductor layer and the top surface of the first sacrificial layer 54 to form a second covering layer 55 that covers the top surface of the second region 22 of the semiconductor layer and the top surface of the first sacrificial layer 54, as shown in FIG. 3F. Then, the second filling layer 52 is removed by etching, so as to expose the fourth through hole 38 and the fifth through hole 39. Part of the second sub-semiconductor layers 32 located in the second region 22 are removed along the fourth through hole 38 and the fifth through hole 39, so as to form first gap regions each located between two adjacent ones of the first sub-semiconductor layers 31. After that, after a dielectric material such as nitride (for example, silicon nitride) or the like is filled in the fourth through hole 38, the fifth through hole 39, and the first gap regions to form the support layer 56, as shown in FIG. 3G.

In some embodiments, the operation that the channel regions 23 are exposed includes the following specific operations.

The first filling layer 42 located in the first through hole 34 and the second through hole 35 is removed to expose the first through hole 34 and the second through hole 35.

The second sub-semiconductor layers 32 located in the first region 21 are removed along the first through hole 34 and the second through hole 35, so as to form second gap regions 47 each located between two adjacent ones of the first sub-semiconductor layers 31.

A second sacrificial layer 46 that fills up the first through hole 34, the second through hole 35, and the second gap regions 47 is formed, as shown in FIG. 3H.

The second sacrificial layer 46 is removed to expose the channel regions 23, the first through hole 34, the second through hole 35, and the second gap regions 47, as shown in FIG. 3I.

Particularly, the first filling layer 42 located in the first through hole 34 and the second through hole 35 and covering the top surface of the first region of the semiconductor layer is removed by an etching process first, so as to expose the first through hole 34 and the second through hole 35. Then, the second sub-semiconductor layers 32 located in the first region 21 are removed along the first through hole 34 and the second through hole 35 by a wet etching process, so as to form second gap regions 47 each located between two adjacent ones of the first sub-semiconductor layers 31. In order to simultaneously form the isolation layer located in the third region 20 (for example, bit line isolation layer configured to electrically isolate two adjacent ones of the bit lines), after the second gap regions 47 are formed, the second sacrificial layer 46 that fills up the first through hole 34, the second through hole 35, and the second gap regions 47 and covers the third region 20 of the semiconductor layer is formed first rather than performing a process for forming the gate layers directly, as shown in FIG. 3H. The second sacrificial layer 46 is configured to form the isolation layers in the third region 20. After that, the second sacrificial layer 46 located in the first region 21 is removed to expose the channel regions 23, the first through hole 34, the second through hole 35, and the second gap regions 47, as shown in FIG. 3I.

Figure 3J:
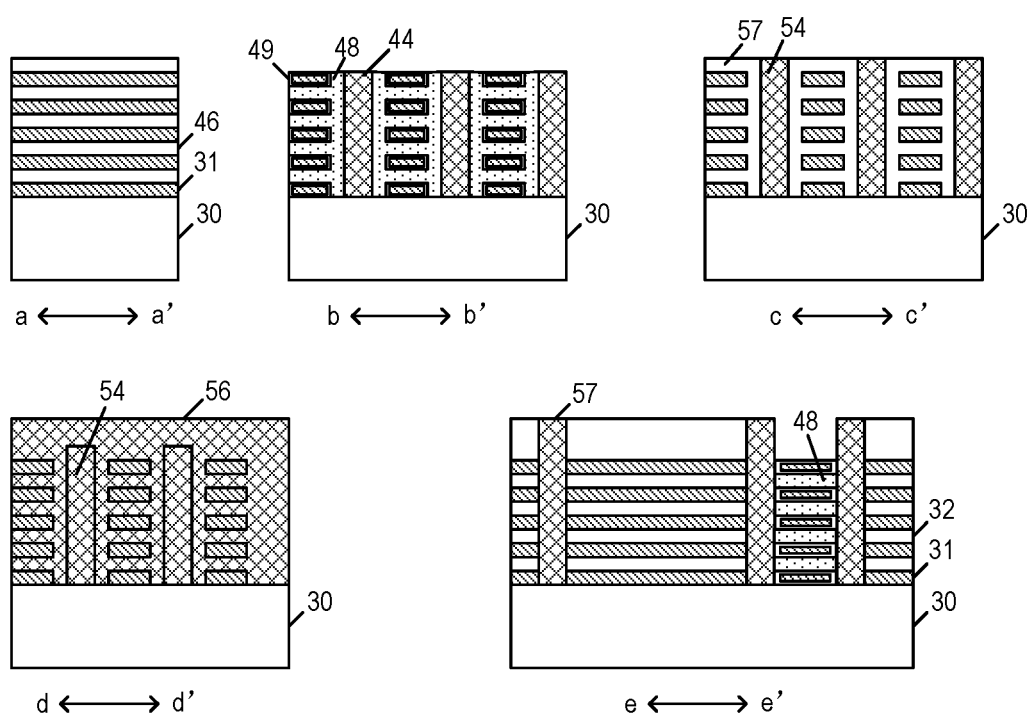
FIG. 3J illustrates a tenth schematic diagram of sectional views of main processes during forming the memory of a specific embodiment of the disclosure.

At S17, a gate layer 48 that covers the surfaces of the channel regions 23 is formed, as shown in FIG. 3J.

In some embodiments, the operation that the gate layer 48 that covers the surfaces of the channel regions 23 includes the following specific operation.

The gate layer 48 that fills the first through hole 34, the second through hole 35, and the second gap regions 47 is formed.

In some embodiments, the operation that the gate layer 48 that fills the first through hole 34, the second through hole 35, and the second gap regions 47 includes the following specific operations.

The gate dielectric layers 49 that cover the surfaces of the channel regions 23 are formed.

The gate layer 48 that fills the first through hole 34, the second through hole 35, and the second gap regions 47 and covers the surfaces of the gate dielectric layers 49 is formed, as shown in FIG. 3J.

In some embodiments, the material of the first sub-semiconductor layer 31 is silicone. The operation that the gate dielectric layers 49 that cover the surfaces of the channel regions 23 includes the following specific operation.

The surfaces of the channel regions 23 are oxidized in situ to form the gate dielectric layers 49.

Taking the material of the first sub-semiconductor layer 31 being silicon as an example for describing below. For example, after the structure as shown in FIG. 3I is formed, the surfaces of the channel regions 23 are oxidized in situ by using an in-situ oxidation process (for example, an in-situ steam generation process), so as to form the gate dielectric layers 49. After that, a conductive material such as tungsten is deposited along the first through hole 34 and the second through hole 35 by an atomic layer deposition process, so as to form the gate layer 48 that fills the first through hole 34, the second through hole 35, and the second gap regions 47 and covers the surfaces of the gate dielectric layers 49, as shown in FIG. 3J.

In some embodiments, the barrier layer 44 is a single-layer structure. In some other embodiments, the operation that the barrier layer 44 that fills the third through hole 43 is formed includes the following operations.

A first sub-barrier layer 441 that fills the third through hole 43 is formed.

The first sub-barrier layer 441 is etched to form an etching hole extending in the direction perpendicular to the top surface of the substrate 30.

A second barrier layer 442 is formed in the etching hole.

In some embodiments, the material of the second sub-barrier layer 442 is a nitride material, and the material of the first sub-barrier layer 441 is an oxide material.

In some embodiments, the second sub-barrier layer 442 is located inside the first sub-barrier layer 441.

Figure 3K:
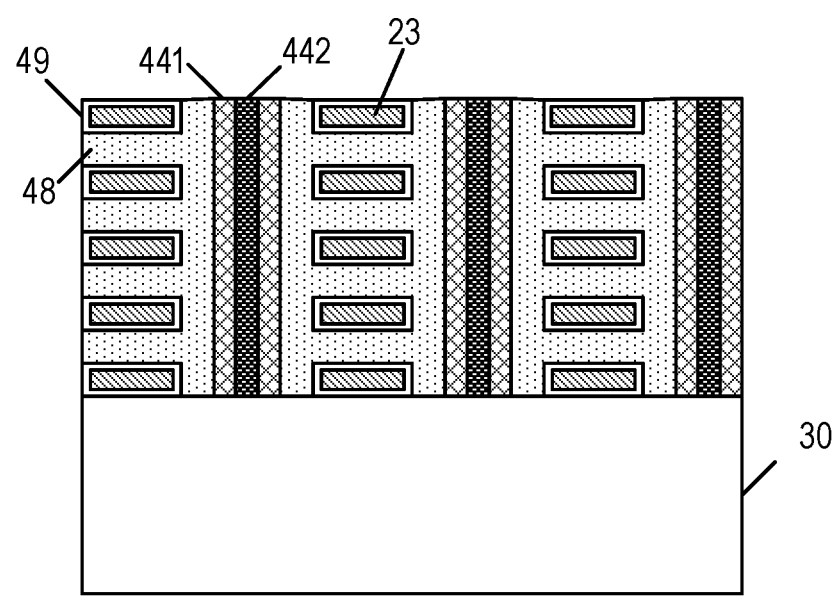
FIG. 3K illustrates an eleventh schematic diagram of sectional views of main processes during forming the memory of a specific embodiment of the disclosure.

Particularly, the third through hole 43 is formed through a self-aligned etching process before forming the gate layer 48, and the barrier layer 44 is formed by filling the third through hole 43, so that the choice of materials for the barrier layer 44 is expanded, and the barrier layer with a multi-layer structure can also be formed Therefore, the electrical isolation performance of the barrier layer is improved, meanwhile, the parasitic capacitance inside the barrier layer is reduced. The material of the first sub-barrier layer 441 may be, but is not limited to, a nitride (for example, silicon nitride) material, and the material of the second sub-barrier layer 442 is an oxide (for example, silicon dioxide) material. FIG. 3K illustrates a structural schematic diagram of a memory including a first sub-barrier layer 441 and a second sub-barrier layer 442.

In another embodiment, the barrier layer may further include a first sub-barrier layer and a second sub-barrier layer located between two adjacent ones of the gate layers 48 and arranged in the second direction b-b', and the material of the first sub-barrier layer is different from that of the second sub-barrier layer.

Figure 4:
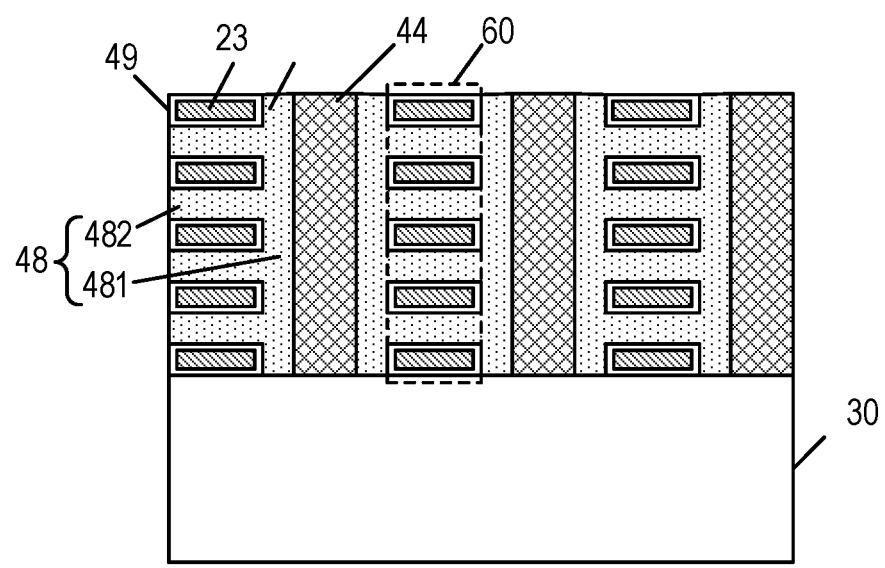
FIG. 4 illustrates a schematic diagram of a sectional view of the memory in a specific embodiment of the disclosure.
Figure 5:
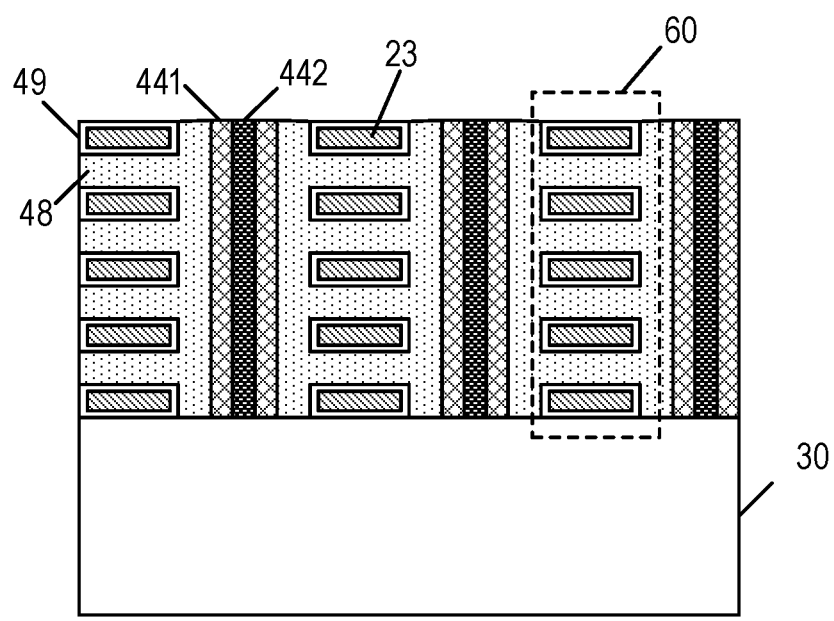
FIG. 5 illustrates a schematic diagram of another sectional view of the memory in a specific embodiment of the disclosure.

The present specific embodiment further provides a memory. FIG. 4 illustrates a schematic diagram of a sectional view of a memory in the specific embodiment of the disclosure. FIG. 5 illustrates a schematic diagram of another sectional view of the memory in the specific embodiment of the disclosure. The memory provided by the present specific embodiment may be formed by the method for forming a memory as shown in FIG. 1, FIG. 2, and FIG. 3A to FIG. 3K. As shown in FIG. 2, FIG. 3A to FIG. 3K, FIG. 4, and FIG. 5, the memory includes a substrate 30, a plurality of channel region groups 60, a plurality of barrier layers 44 and a plurality of gate layers 48.

The channel region groups 60 are located above the substrate 30. In the direction parallel to the top surface of the substrate 30, the plurality of channel region groups 60 are arranged in parallel. Each of the channel region groups 60 includes a plurality of channel regions 23 arranged in parallel in the direction perpendicular to the top surface of the substrate 30.

The barrier layers 44 are located above the substrate 30, and each of the barrier layers 44 is located between two adjacent ones of the channel region groups 60.

The gate layers 48 are located above the substrate 30. Each of the gate layers 48 is at least located between one barrier layer 44 and one channel region group 60, and covers the surfaces of all channel regions 23 in the channel region group 60. The thicknesses of the gate layers 48 located on two opposite sides of one of the barrier layers 44 are equal.

In some embodiments, the barrier layers 44 have a single-layer structure, as shown in FIG. 4.

Or, the barrier layers 44 have a multi-layer structure.

In some embodiments, each of the barrier layers 44 includes: a first sub-barrier layer 441 and a second sub-barrier layer 442.

The first sub-barrier layer 441 extends in the direction perpendicular to the top surface of the substrate 30 and covers the surface of one gate layer 48.

The second sub-barrier layer 442 extends in the direction perpendicular to the top surface of the substrate 30 and is sandwiched in the first sub-barrier layer 441, as shown in FIG. 5.

In some embodiments, the material of the first sub-barrier layer 441 is a nitride material, and the material of the second sub-barrier layer is an oxide material.

In some embodiments, each of the gate layers may 48 include: a first part 481 and a second part 482.

The first part 481 extends in the direction perpendicular to the top surface of the substrate 30, and continuously covers the side walls of all of the channel regions 23 in a same channel region group 60. The thicknesses of the first parts 481 of two gate layers 48 located on the two opposite sides of one barrier layer 44 are equal.

The second part 482 is connected to the first part 481, and is located between two adjacent channel regions 23 in the same channel region group 60.

In some embodiments, the memory further includes gate dielectric layers 49.

The gate dielectric layers 49 cover the surfaces of the channel regions 23, and the gate layers 48 cover the surfaces of the gate dielectric layers 49.

In some embodiments, the memory further includes source areas, drain sources, capacitors, and bit lines.

A source area and a drain area are arranged on two opposite sides 23 of one channel region.

A capacitor is connected to the drain area.

A bit line is connected to the source area.

According to the memory and the method for forming the memory provided by some embodiments of the present specific implementation mode, a first isolation structure between adjacent active pillars is formed while etching the semiconductor layer to form the active pillars, and the first isolation structure includes a first through hole, a second through hole, and a first isolation pillar located between the first through hole and the second through hole. Then, the first isolation structure is etched to form the barrier layer by self-aligned exposure before forming the gate layer, so that the choice of materials for the barrier layer is expanded, the manufacturing process of the memory is simplified, and it is helpful to improve the isolation effect between adjacent gate layers and reduce the capacitive coupling effect between adjacent gate layers. Moreover, according to some embodiments of the disclosure, the first isolation structure including the first isolation pillar is formed while the active pillars are formed by etching, and the barrier layer is formed by a self-aligned process subsequently, which avoids an error produced by photoetching alignment, thereby reducing the thickness difference between adjacent gate layers, and improving the thickness uniformity among a plurality of gate layers in the memory.

The above are preferred implementation modes of the disclosure. It is to be noted that a number of modifications and refinements may be made by those of ordinary skill in the art without departing from the principles of the disclosure, and such modifications and refinements are also considered to be within the scope of protection of the disclosure.

What is claimed is:

1. A method for forming a memory, comprising:
   forming a substrate and a semiconductor layer located on the substrate;
   patterning the semiconductor layer to form a plurality of first isolation structures, wherein part of the semiconductor layer retained between two adjacent ones of the first isolation structures forms channel regions, wherein each of the first isolation structures comprises a first through hole and a second through hole penetrating through the semiconductor layer in a direction perpendicular to a top surface of the substrate, and a first isolation pillar formed by the semiconductor layer retained between the first through hole and the second through hole;
   forming a first filling layer that fills up the first through hole and the second hole;
   removing the first isolation pillar to form a third through hole located in the first filling layer;
   forming a barrier layer that fills up the third through hole;
   exposing the channel regions by removing the first filling layer; and
   forming a gate layer that covers surfaces of the channel regions.

2. The method for forming a memory of claim 1, wherein the forming the substrate and the semiconductor layer located on the substrate comprises:
   providing a substrate; and
   alternately depositing first sub-semiconductor layers and second sub-semiconductor layers on the top surface of the substrate in the direction perpendicular to the top surface of the substrate to form the semiconductor layer.

3. The method for forming a memory of claim 2, wherein the patterning the semiconductor layer comprises:
   etching the semiconductor layer to form a plurality of the first isolation structures that extend in a first direction and are parallel to each other, wherein each of the first isolation structures comprises the first isolation pillar, and the first through hole and the second through hole arranged on two opposite sides of the first isolation pillar in a second direction; the first sub-semiconductor layers retained between two adjacent ones of the first isolation structures form the channel regions, the first direction is a direction parallel to the top surface of the substrate, and the second direction is a direction parallel to the top surface of the substrate and intersects the first direction.

4. The method for forming a memory of claim 3, wherein a width of the first through hole is equal to a width of the second through hole in the second direction.

5. The method for forming a memory of claim 3, wherein the semiconductor layer comprises a first region, and a second region arranged at an outer side of the first region in the first direction; and the etching the semiconductor layer comprises:
   etching the first region and the second region of the semiconductor layer to form a plurality of the first isolation structures and a plurality of the channel regions in the first region, and simultaneously, to form a plurality of second isolation structures in the second region, wherein the semiconductor layer retained between two adjacent ones of the second isolation structures forms virtual channel regions; each of the second isolation structures comprises a fourth through hole and a fifth through hole penetrating through the semiconductor layer in the direction perpendicular to the top surface of the substrate, and a second isolation pillar formed by the semiconductor layer retained between the fourth through hole and the fifth through hole.

6. The method for forming a memory of claim 5, wherein a width of the first isolation pillar is less than a width of the channel regions in the second direction.

7. The method for forming a memory of claim 5, wherein the forming the third through hole located in the first filling layer comprises:
   etching the first filling layer located on a top surface of the semiconductor layer in the first region to form a first opening exposing the first isolation pillar; and
   removing the first isolation pillar along the first opening to form the third through hole in the first region,
   wherein a width of the first opening is greater than or equal to a width of the first isolation pillar in the second direction.

8. The method for forming a memory of claim 7, wherein the forming the barrier layer that fills up the third through hole comprises:
   depositing an insulating material in the third through hole along the first opening to form the barrier layer in the first region.

9. The method for forming a memory of claim 5, further comprising:
   forming a support layer in the second region of the semiconductor layer before exposing the channel regions.

10. The method for forming a memory of claim 9, wherein the forming the support layer in the second region of the semiconductor layer comprises:
    forming a second filling layer that fills up the fourth through hole and the fifth through hole and covers a top surface of the second region;

removing the second isolation pillar to form a sixth through hole in the second filling layer;

forming a first sacrificial layer in the sixth through hole;

removing the second filling layer from the fourth through hole and the fifth through hole to expose the fourth through hole and the fifth through hole;

removing part of the second sub-semiconductor layers located in the second region through the fourth through hole and the fifth through hole to form a first gap region located between adjacent first sub-semiconductor layers; and filling a dielectric material in the fourth through hole, the fifth through hole and the first gap region to form the support layer.

11. The method for forming a memory of claim 5, wherein the exposing the channel regions comprises:

removing the first filling layer located in the first through hole and the second through hole to expose the first through hole and the second through hole;

removing the second sub-semiconductor layers located in the first region through the first through hole and the second through hole to form a second gap region located between adjacent first sub-semiconductor layers;

forming a second sacrificial layer that fills up the first through hole, the second through hole and the second gap region; and removing the second sacrificial layer to expose the channel regions, the first through hole, the second through hole and the second gap region.

12. The method for forming a memory of claim 11, wherein forming the gate layer that covers the surfaces of the channel regions comprises:

forming gate dielectric layers that cover the surfaces of the channel regions; and forming the gate layer that fills the first through hole, the second through hole and the second gap region and covers the surfaces of the gate dielectric layers.

13. The method for forming a memory of claim 12, wherein a material of the first sub-semiconductor layer is silicon; and the forming the gate dielectric layers that cover the surfaces of the channel regions comprises:

in-situ oxidizing the surfaces of the channel regions to form the gate dielectric layers.

14. The method for forming a memory of claim 1, wherein forming the barrier layer that fills up the third through hole comprises:

forming a first sub-barrier layer that fills up the third through hole;

etching the first sub-barrier layer to form an etching hole extending in the direction perpendicular to the top surface of the substrate; and forming a second sub-barrier layer in the etching hole.

15. The method for forming a memory of claim 14, wherein the second sub-barrier layer is located in the first sub-barrier layer.

* * * * *